(12) United States Patent
Suzuki et al.

(10) Patent No.: US 11,381,149 B2
(45) Date of Patent: Jul. 5, 2022

(54) SWITCHING ELEMENT CONTROL CIRCUIT AND POWER MODULE

(71) Applicant: SHINDENGEN ELECTRIC MANUFACTURING CO., LTD., Tokyo (JP)

(72) Inventors: Kenichi Suzuki, Saitama (JP); Wataru Miyazawa, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 160 days.

(21) Appl. No.: 16/648,664

(22) PCT Filed: Sep. 25, 2017

(86) PCT No.: PCT/JP2017/034488
§ 371 (c)(1),
(2) Date: Jun. 18, 2020

(87) PCT Pub. No.: WO2019/058544
PCT Pub. Date: Mar. 28, 2019

(65) Prior Publication Data
US 2021/0159771 A1    May 27, 2021

(51) Int. Cl.
*H03K 17/687* (2006.01)
*H02M 1/08* (2006.01)
(Continued)

(52) U.S. Cl.
CPC .......... *H02M 1/08* (2013.01); *H03K 17/0812* (2013.01); *H03K 17/165* (2013.01); *H03K 17/567* (2013.01); *H03K 17/687* (2013.01)

(58) Field of Classification Search
CPC ..... H02M 1/08; H03K 17/0812; H03K 17/14; H03K 17/18; H03K 17/0412;
(Continued)

(56) References Cited

U.S. PATENT DOCUMENTS

2008/0079684 A1* 4/2008 Novoselov ........... G09G 3/3677
345/100
2009/0032873 A1* 2/2009 Cites ................. H01L 29/78603
257/347
(Continued)

FOREIGN PATENT DOCUMENTS

JP     2012-244613 A    12/2012
JP     2013-99181 A      5/2013
(Continued)

OTHER PUBLICATIONS

International Search Report in PCT/JP2017/034488, dated Oct. 24, 2017. 4pp.

*Primary Examiner* — Sibin Chen
(74) *Attorney, Agent, or Firm* — Hauptman Ham, LLP

(57) ABSTRACT

A switching element control circuit includes: a third electrode voltage control part which controls a third electrode voltage; a first electrode current detection part which detects a first electrode current which flows through the switching element; a memory part which stores information including an initial threshold voltage and an initial first electrode current, and a drain current characteristic of a threshold voltage; and a threshold voltage calculation part which calculates a threshold voltage at a time of operating the switching element based on information including the first electrode current, the initial threshold voltage, and an initial first electrode current, and information relating to the first electrode current characteristic of the threshold voltage, wherein the third electrode voltage control part controls the third electrode voltage based on a threshold voltage at the time of operating the switching element calculated by the threshold voltage calculation part.

16 Claims, 10 Drawing Sheets

(51) Int. Cl.
*H03K 17/0812* (2006.01)
*H03K 17/567* (2006.01)
*H03K 17/16* (2006.01)

(58) Field of Classification Search
CPC .. H03K 17/567; H03K 17/687; H03K 17/145; H03K 17/78; H03K 17/04206; H03K 2217/0027
See application file for complete search history.

(56) References Cited

U.S. PATENT DOCUMENTS

2013/0147525 A1  6/2013  Takagiwa
2014/0077846 A1  3/2014  Taguchi et al.

FOREIGN PATENT DOCUMENTS

JP   2014-60594 A   4/2014
WO   2012/153459 A1  11/2012

\* cited by examiner

SWITCHING ELEMENT CONTROL CIRCUIT AND POWER MODULE

RELATED APPLICATIONS

The present application is a National Phase of International Application Number PCT/JP2017/034488, filed Sep. 25, 2017.

TECHNICAL FIELD

The present invention relates to a switching element control circuit and a power module.

BACKGROUND ART

Conventionally, there has been known a switching element control circuit which controls an ON/OFF operation of a switching element (see patent document 1, for example).

As shown in FIG. 12, a conventional switching element control circuit 900 includes a gate voltage control part 910 which controls a gate voltage for controlling an ON/OFF operation of a switching element 800.

According to the conventional switching element control circuit 900, an ON/OFF operation of the switching element 800 can be controlled by controlling a gate voltage.

PRIOR ART DOCUMENT

Patent Document

Patent document 1: WO/2012/153459

SUMMARY OF INVENTION

Problem to be Solved by the Invention

Recently, there has been a demand for a switching element control circuit capable of reducing a switching loss by increasing a switching speed. As one of methods for satisfying such a demand, a switching element control circuit is considered where a switching loss is reduced in such a manner that a turn-on period and a turn-off period are shortened by applying a gate voltage slightly exceeding a threshold voltage to a gate electrode thus increasing a switching speed (see FIG. 3A and FIG. 3B).

However, when a relatively large current is supplied to a switching element at the time of operating the switching element, a threshold voltage changes from an initial threshold voltage (the threshold voltage at the time of shipping) (see FIG. 4). Accordingly, there exists a drawback that it is difficult to shorten a turn-on period and a turn-off period by applying a voltage which slightly exceeds the threshold voltage at the time of operating the switching element to a gate electrode whereby it is difficult to reduce a switching loss.

The present invention has been made to overcome the above-mentioned drawback, and it is an object of the present invention to provide a switching element control circuit capable of reducing a switching loss even when a threshold voltage at the time of operating a switching element changes from an initial threshold voltage. It is another object of the present invention to provide a power module provided with such a switching element control circuit.

Solution to Problem

[1] According to the present invention, there is provided a switching element control circuit for controlling an ON/OFF operation of a switching element which includes a first electrode, a second electrode, and a third electrode, the switching element control circuit including: a third electrode voltage control part which controls a third electrode voltage for controlling the ON/OFF operation of the switching element; a first electrode current detection part which detects a first electrode current which flows through the switching element; a memory part which stores information including an initial threshold voltage of the switching element and an initial first electrode current which flows through the switching element when the initial threshold voltage is measured, and information relating to a first electrode current characteristic of a threshold voltage of the switching element; and a threshold voltage calculation part which calculates a threshold voltage at a time of operating the switching element based on information including the initial threshold voltage, the initial first electrode current, and a first electrode current detected by the first electrode current detection part, and information relating to the first electrode current characteristic of the threshold voltage of the switching element, wherein the third electrode voltage control part controls the third electrode voltage, at the time of bringing the switching element into an ON state, based on a threshold voltage Vth at the time of operating the switching element calculated by the threshold voltage calculation part.

[2] In the switching element control circuit according to the present invention, it is preferable that the first electrode current characteristic of the threshold voltage of the switching element be expressed by a characteristic formula which satisfies a relationship of $Vth=Vth_0+\beta(Id-Id_0)$ assuming that a first electrode current coefficient of the threshold voltage of the switching element is $\beta$, the threshold voltage at the time of operating the switching element is Vth, the initial threshold voltage is $Vth_0$, the first electrode current detected by the first electrode current detection part is Id, and the initial first electrode current is $Id_0$.

[3] In the switching element control circuit according to the present invention, it is preferable that the information including the initial threshold voltage and the initial first electrode current, and the information relating to the first electrode current characteristic of the threshold voltage of the switching element be stored in the memory part in advance.

[4] In the switching element control circuit according to the present invention, it is preferable that the switching element control circuit be a switching element control circuit which performs an initial threshold voltage measurement mode where the initial threshold voltage of the switching element is measured, and a control mode where the ON/OFF operation of the switching element is controlled, the switching element control circuit further include: a threshold voltage measurement power source which supplies a threshold voltage measurement current to the first electrode of the switching element; and an ON/OFF state determination part which determines an ON/OFF state of the switching element, and in the initial threshold voltage measurement mode, the third electrode voltage control part control the third electrode voltage such that the third electrode voltage is increased in a stepwise manner, the ON/OFF state determination part determine whether or not the switching element is turned on based on the first electrode current detected by the first electrode current detection part, and the memory part store the first electrode current detected by the first electrode current detection part as the initial first electrode current and store the third electrode voltage applied to the third electrode as the initial threshold voltage of the switching element when the ON/OFF state determination part determines that the switching element is brought into an ON state.

[5] In the switching element control circuit according to the present invention, it is preferable that the switching element control circuit be a switching element control circuit which further performs a first electrode current characteristic measurement mode where a first electrode switching element is measured after the control mode is performed for a predetermined time, the switching element control circuit further include a first electrode current characteristic calculation part which calculates a first electrode current characteristic of a threshold voltage of the switching element, and in the first electrode current characteristic measurement mode, the third electrode voltage control part control the third electrode voltage such that the third electrode voltage is increased in a stepwise manner, the ON/OFF state determination part determine whether or not the switching element is turned on based on the first electrode current detected by the first electrode current detection part, the memory part store the first electrode current detected by the first electrode current detection part and store the third electrode voltage applied to the third electrode as a first electrode current characteristic measurement time threshold voltage of the switching element when the ON/OFF state determination part determines that the switching element is brought into an ON state, and the first electrode current characteristic calculation part calculate the first electrode current characteristic of the threshold voltage of the switching element based on information including the initial threshold voltage, the initial first electrode current, the first electrode current detected by the first electrode current detection part in the first electrode current characteristic measurement mode, and the first electrode current characteristic measurement time threshold voltage.

[6] In the switching element control circuit according to the present invention, it is preferable that the third electrode voltage control part control the third electrode voltage such that the third electrode voltage is increased in a step-like manner along with a lapse of time in the initial threshold voltage measurement mode.

[7] in the switching element control circuit according to the present invention, it is preferable that the third electrode voltage control part control the third electrode voltage such that the third electrode voltage becomes a pulse-like voltage which is a pulse increasing an amplitude along with a lapse of time in the initial threshold voltage measurement mode.

[8] In the switching element control circuit according to the present invention, it is preferable that the switching element control circuit be a switching element control circuit which performs a first electrode current characteristic measurement mode where the first electrode current characteristic of the threshold voltage of the switching element is measured after a control mode where an ON/OFF operation of the switching element is controlled is performed for a predetermined time, the switching element control circuit further include: a threshold voltage measurement power source which supplies a threshold voltage measurement current to the first electrode of the switching element; an ON/OFF state determination part which determines an ON/OFF state of the switching element; and a first electrode current characteristic calculation part which calculates a first electrode current characteristic of a threshold voltage of the switching element, and in the first electrode current characteristic measurement mode, the third electrode voltage control part control the third electrode voltage such that the third electrode voltage is increased in a stepwise manner, the ON/OFF state determination part determine whether or not the switching element is turned on based on the first electrode current detected by the first electrode current detection part, the memory part, when the ON/OFF state determination part determines that the switching element is brought into an ON state, store the first electrode current which flows through the switching element and store the third electrode voltage applied to the third electrode as a first electrode current characteristic measurement time threshold voltage of the switching element, and the first electrode current characteristic calculation part calculate the first electrode current characteristic of a threshold voltage of the switching element based on information including the initial threshold voltage, initial first electrode current, the first electrode current which flows through the switching element in the first electrode current characteristic measurement mode, and the first electrode current characteristic measurement time threshold voltage.

[9] in the switching element control circuit according to the present invention, it is preferable that the third electrode voltage control part control the third electrode voltage such that the third electrode voltage is increased in a step-like manner along with a lapse of time in the first electrode current characteristic measurement mode.

[10] In the switching element control circuit according to the present invention, it is preferable that the third electrode voltage control part control the third electrode voltage such that the third electrode voltage becomes a pulse-like voltage which is a pulse increasing an amplitude along with a lapse of time in the first electrode current characteristic measurement mode.

[11] In the switching element control circuit according to the present invention, it is preferable that the information relating to the first electrode current characteristic of the threshold voltage of the switching element include data where the first electrode current and the threshold voltage corresponding to the first electrode current form a pair.

[12] In the switching element control circuit according to the present invention, it is preferable that the switching element be a MOSFET, an IGBT or a HEMT.

[13] In the switching element control circuit according to the present invention, it is preferable that the switching element be formed using a material which contains GaN, SiC or $Ga_2O_3$.

[14] According to the present invention, there is provided a power module which includes: a switching element provided with a first electrode, a second electrode, and a third electrode; and the switching element control circuit described in any one of [1] to [13] which controls an ON/OFF operation of the switching element.

Advantageous Effects of Invention

According to the switching element control circuit and the power module of the present invention, the threshold voltage calculation part calculates a threshold voltage at the time of operating the switching element based on information including a first electrode current detected by the first electrode current detection part, and the third electrode voltage control part, when the switching element is brought into an ON state, controls a third electrode voltage based on the threshold voltage at the time of operating the switching element calculated by the threshold voltage calculation part. Accordingly, even when the threshold voltage changes from an initial threshold voltage due to supplying of a relatively large electric current to the switching element at the time of operating the switching element (see FIG. 4), it is possible to apply a voltage which slightly exceeds the threshold voltage at the time of operating the switching element to the third electrode (see FIG. 3B). Accordingly, a turn-on period and a turn-off period can be shortened. As a result, a switching loss can be reduced.

BRIEF DESCRIPTION OF DRAWINGS

FIG. 3A is a schematic view of a graph showing a change with time of a gate-source voltage when a gate voltage is applied to a gate electrode in a switching element control circuit according to a comparison example, and FIG. 3B is a schematic view of a graph showing a change with time of a gate-source voltage when a gate voltage which slightly exceeds a threshold voltage is applied to u gate electrode in the switching element control circuit 100 according to the embodiment 1.

DESCRIPTION OF EMBODIMENTS

Hereinafter, a switching element control circuit and a power module according to the present invention are described based on embodiments shown in drawings. The respective drawings are schematic views, and do not always strictly reflect the actual circuit configuration and actual graphs.

Embodiment 1

1. Configuration of Power Module 1 and Switching Element Control Circuit 100 According to Embodiment 1

Figure 1:
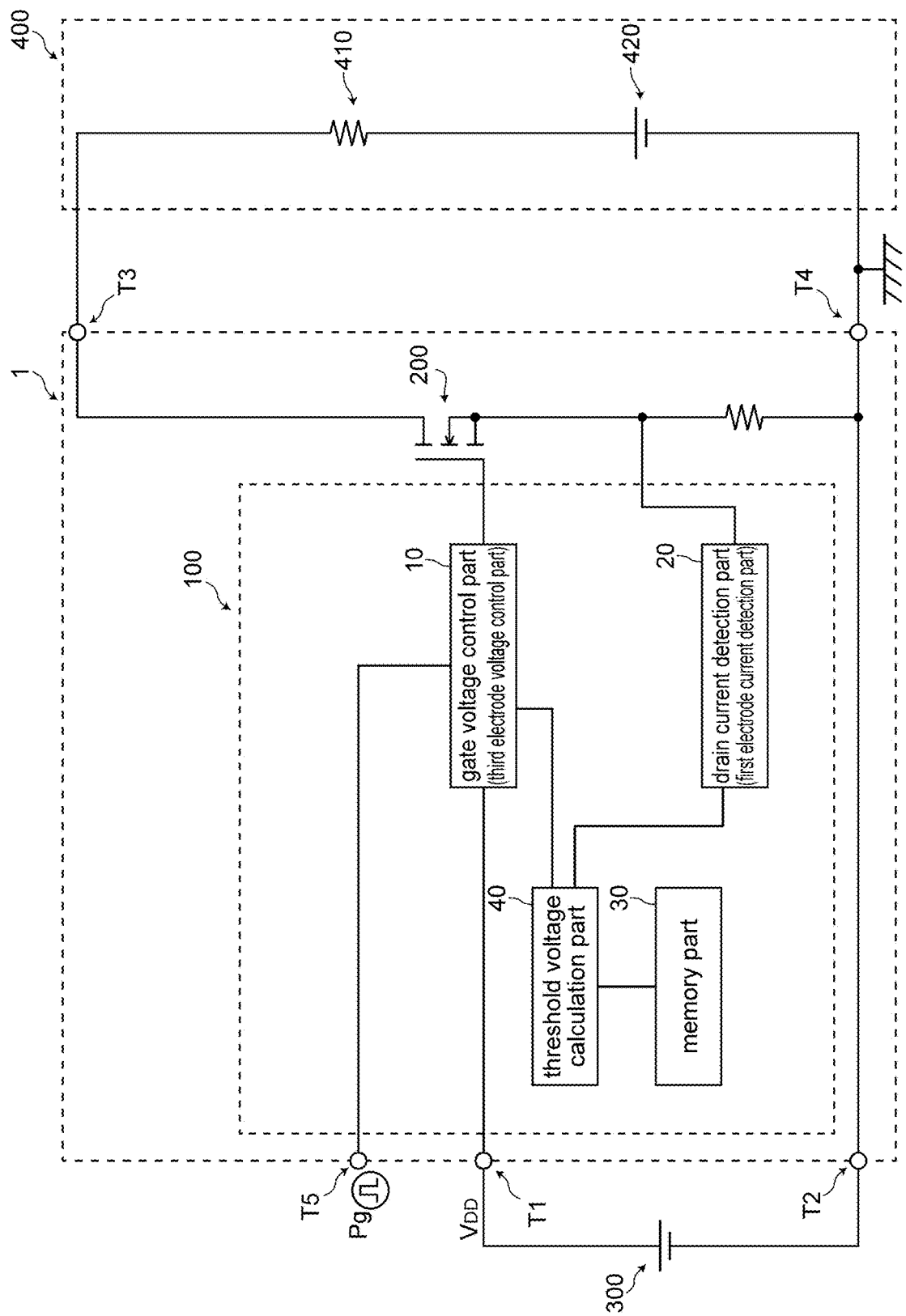
FIG. 1 is a circuit diagram showing a power module 1 and a switching element control circuit 100 according to an embodiment 1.

As shown in FIG. 1, a power module 1 according to the embodiment 1 includes: a switching element. 200; and a switching element control circuit 100 according to the embodiment 1 which controls an ON/OFF operation of the switching element 200. The power module 1 according to the embodiment 1 is covered by a package formed using a resin, ceramic or the like having high heat resistance and high insulation property. The power module 1 according to the embodiment 1 includes: a (+) side input terminal T1 to which a DC power source voltage $V_{DD}$ is inputted; a (−) side input terminal T2 on a ground side, a (+) side output terminal T3; a (−) side output terminal. T4 on the ground side; and a control terminal T5 to which a drive signal (for example, a gate pulse) Pg is inputted.

A gate drive power source 300 for applying a power source voltage $V_{DD}$ is connected between the (+) side input terminal T1 and the (−) side input terminal T2. The gate drive power source 300 is connected to a gate electrode of the switching element 200 via a gate voltage control part 10, and supplies a voltage to the gate electrode. A load circuit 400 is connected to the (+) side output terminal T3 and the (−) side output terminal T4. The load circuit 400 includes, for example, a load resistor 410 and a DC drive power source 420. The load resistor 410 and the DC drive power source 420 are connected in series between the (+) side output terminal T3 and the (−) side output terminal T4. The (−) side output terminal T4 is grounded.

The switching element 200 is a MOSFET which includes a source electrode (second electrode), a drain electrode (first electrode), and the gate electrode (third electrode). The switching element 200 is brought into an ON state when a gate voltage (third electrode voltage) which exceeds a threshold voltage is applied to the gate electrode, and is brought into an OFF state when the gate voltage becomes lower than the threshold voltage. The gate voltage is supplied from the power source voltage $V_{DD}$, and is controlled by the gate voltage control part 10 (third electrode voltage control part) described later. The switching element 200 is formed using a material which contains GaN. When the switching element 200 contains GaN, a difference between an absolute maximum rated voltage and a threshold voltage of the gate electrode becomes small.

a drain electrode of the switching element 200 is connected to the load circuit 400 via the (+) side output terminal T3. The gate electrode of the switching element 200 is connected to the gate voltage control part 10. The source electrode of the switching element 200 is connected to the (−) side output terminal T4 via a resistor.

The switching element control circuit 100 according to the embodiment 1 includes the gate voltage control part 10 (third electrode voltage control part), a drain current detection part 20 (first electrode current detection part), a memory part 30, and a threshold voltage calculation part 40 (see FIG. 1).

The gate voltage control part 10 is connected to the threshold voltage calculation part 40. The gate voltage control part 10 controls a gate voltage for controlling ON/OFF of the switching element 200 based on an inputted drive signal (for example, a gate pulse) Pg.

The drain current detection part 20 has a drain current detection element, and is connected to the threshold voltage calculation part 40. A suitable current detection element such as a resistor or a Rogowski coil can be used as the drain current detection element.

The memory part 30 is connected to the threshold voltage calculation part 40. In the memory part 30, information including an initial threshold voltage $Vth_0$ of the switching element 200 (a lower limit value of a threshold voltage of the in-use switching element 200 set in advance) and an initial drain current $Id_0$ (initial first electrode current) which flows through the switching element 200 when the initial threshold voltage $Vth_0$ is measured, and information relating to a drain current characteristic (first electrode current characteristic) of a threshold voltage of the switching element 200 are stored in advance. Accordingly, it is unnecessary to measure the initial threshold voltage $Vth_0$ and the initial drain current $Id_0$ after the switching element 200 is assembled to the switching element control circuit 100.

Figure 4:
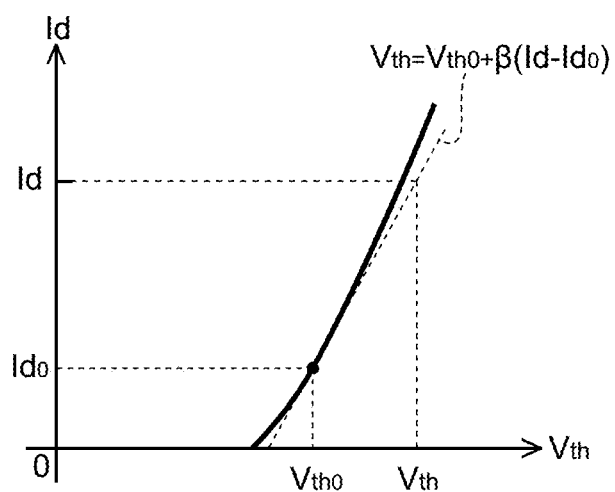
FIG. 4 is a schematic graph showing a relationship between a threshold voltage Vth and a drain current Id of the switching element.

As shown in FIG. 4, the drain current characteristic of the threshold voltage of the switching element 200 is that the threshold voltage is increased as the drain current is increased. In the embodiment 1, the drain current characteristic of the threshold voltage of the switching element is expressed by a characteristic formula which satisfies a relationship of $Vth=Vth_0+\beta(Id-Id_0)$ assuming that drain current coefficient (first electrode current coefficient) of the threshold voltage of the switching element 200 is $\beta$, the threshold voltage at the time of operating the switching element is Vth, the initial threshold voltage is $Vth_0$, the drain current detected by the drain current detection part 20 is Id, and the drain current which flows through the switching element 200 when the initial threshold voltage $Vth_0$ is measured is $Id_0$ (see a straight line indicated by dots in FIG. 4). That is, the drain current characteristic of the threshold voltage of the switching element 200 approximates a linear function with a positive slope.

Figure 2:
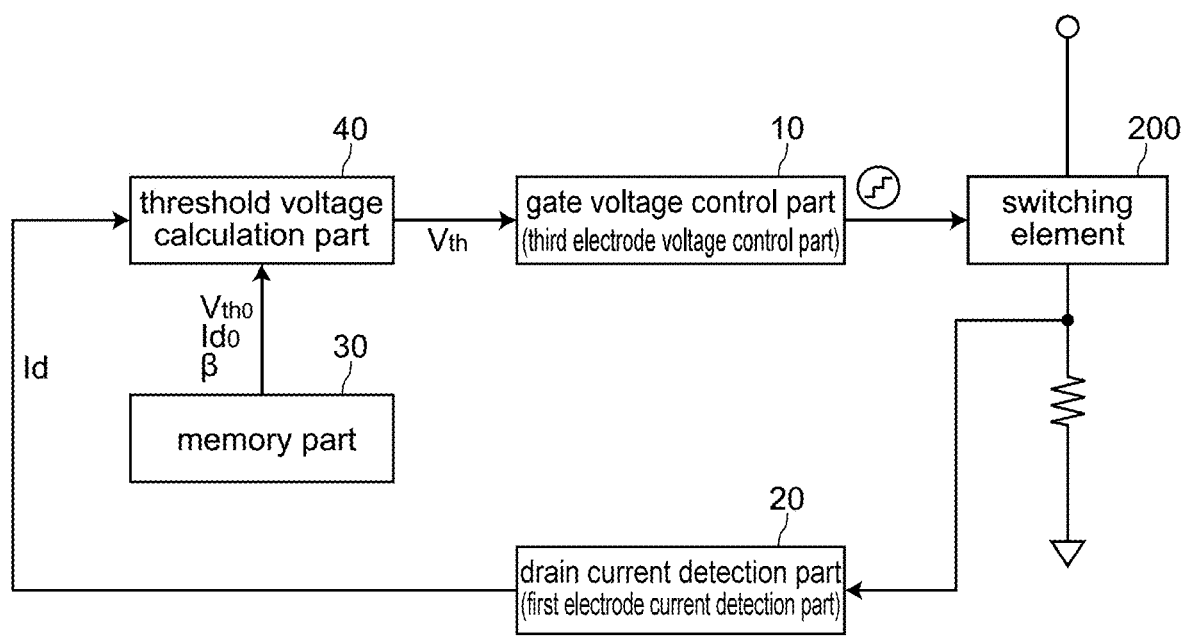
FIG. 2 is a block diagram for explaining the switching element control circuit 100 according to the embodiment 1.

When the switching element 200 is brought into an ON state, the switching element control circuit 100 according to the embodiment 1 decides a gate voltage applied to the gate electrode as follows (see FIG. 2).

First, the drain current detection part 20 detects a drain current Id which flows through the switching element 200.

Next, the threshold voltage calculation part 40 reads information including an initial threshold voltage $Vth_0$ of the switching element 200 (a lower limit value of a threshold voltage of the in-use switching element 200 set in advance) and an initial drain current $Id_0$, and information relating to a drain current characteristic of a threshold voltage of the switching element 200 from the memory part 30. Further, the threshold voltage calculation part 40 reads the drain current Id which flows through the switching element 200 from the drain current detection part 20, and calculates a threshold voltage Vth at the time of operating the switching element 200 by putting these information into the characteristic formula of $Vth=Vth_0+\beta(Id-Id_0)$ (see FIG. 4).

Figure 3A:
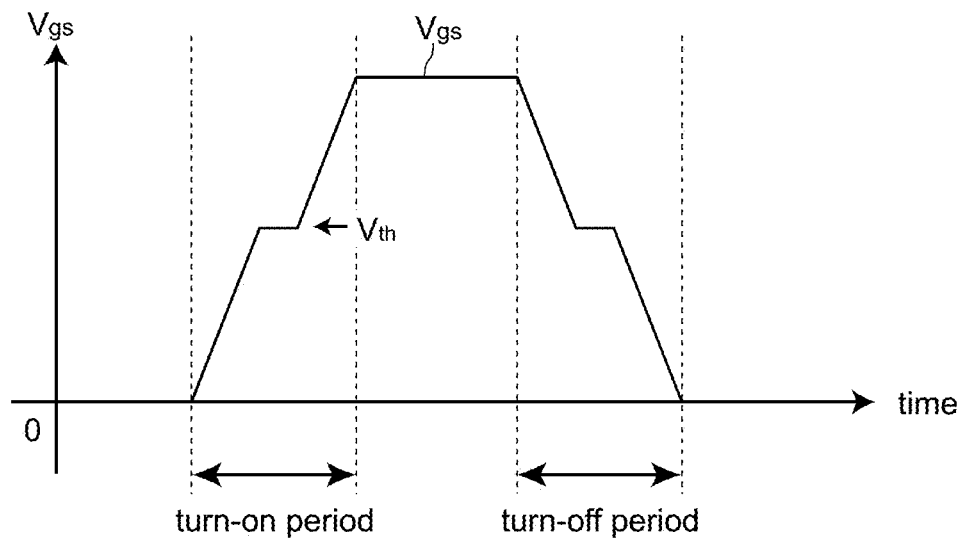
FIG. 3A and FIG. 3B are views for explaining effects when a gate voltage which slightly exceeds a threshold voltage is applied to a gate electrode.
Figure 3B:
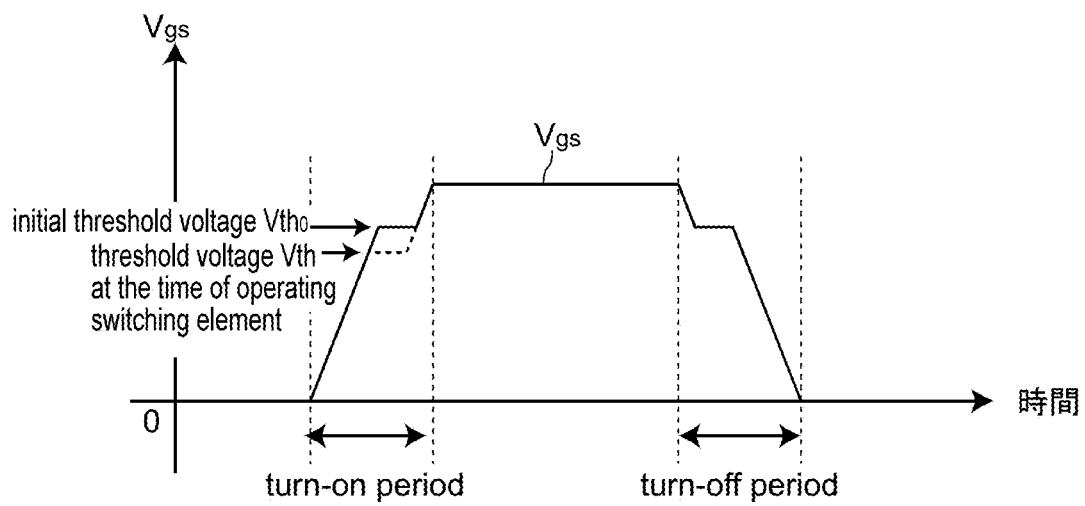

Next, the gate voltage control part 10 applies a gate voltage which slightly exceeds the threshold voltage Vth to the gate electrode based on the threshold voltage Vth at the time of operating the switching element 200 calculated by the threshold voltage calculation part 40 (see FIG. 3). In this manner, a gate voltage applied to the gate electrode is decided.

In the switching element control circuit 100 according to the embodiment 1, a gate voltage may be constantly controlled in accordance with a drain current of the switching element 200. Alternatively, a gate voltage may be controlled such that a drain current of the switching element 200 is detected every predetermined time, a threshold voltage at the time of operating the switching element 200 is calculated, and the gate voltage is controlled based on the threshold voltage at the time of operating the switching element 200.

2. Advantageous Effects Acquired by Switching Element Control Circuit 100 and Power Module 1 According to Embodiment 1

According to the switching element control circuit 100 and the power module 1 of the embodiment 1, the threshold voltage calculation part 40 calculates a threshold voltage Vth at the time of operating the switching element 200 based on information including a drain current detected by the drain current detection part 20, and when the switching element 200 is brought into an ON state, the gate voltage control part 10 controls a gate voltage based on the threshold voltage Vth at the time of operating the switching element 200 calculated by the threshold voltage calculation part 40. Accordingly, even when the threshold voltage Vth changes from an initial threshold voltage $Vth_0$ due to supplying of a relatively large current to the switching element 200 at the time of operating the switching element 200 (see FIG. 4), it is possible to apply a voltage which slightly exceeds the threshold voltage at the time of operating the switching element 200 to the gate electrode (see FIG. 3B). Accordingly, a turn-on period and a turn-off period can be shortened. As a result, a switching loss can be reduced.

According to the switching element control circuit 100 of the embodiment 1, a drain current characteristic of a threshold voltage of the switching element 200 is expressed by a characteristic formula which satisfies a relationship of $Vth=Vth_0+\beta(Id-Id_0)$ assuming that a drain current coefficient of a threshold voltage of the switching element 200 is $\beta$, a threshold voltage at the time of operating the switching element 200 is Vth, an initial threshold voltage is $Vth_0$, a drain current detected by the drain current detection part 20 is Id, and an initial drain current is $Id_0$. Accordingly, a threshold voltage Vth at the time of operating the switching element 200 can be relatively easily calculated.

According to the switching element control circuit 100 of the embodiment 1, even when a difference between an absolute maximum rated voltage and a threshold voltage of the gate electrode is small as in the case of the switching element formed using a material which contains GaN, a voltage which slightly exceeds a threshold voltage Vth at the time of operating the switching element can be applied to the gate electrode. Accordingly, a turn-on period and a turn-off period can be shortened. As a result, a switching loss can be reduced. Further, it is possible to prevent the occurrence of a phenomenon where the switching element 200 is not brought into an ON state even when a gate voltage which slightly exceeds a threshold voltage (threshold voltage on design) is applied to the gate electrode. As a result, an ON/OFF operation of the switching element 200 can be controlled with certainty.

Further, according to the power module 1 of the embodiment 1, the switching element 200 is formed using a material which contains GaN. Accordingly, an ON resistance of the switching element 200 is lowered and hence, it is possible to provide a power module which exhibits a small conduction loss.

Embodiment 2

Figure 5:
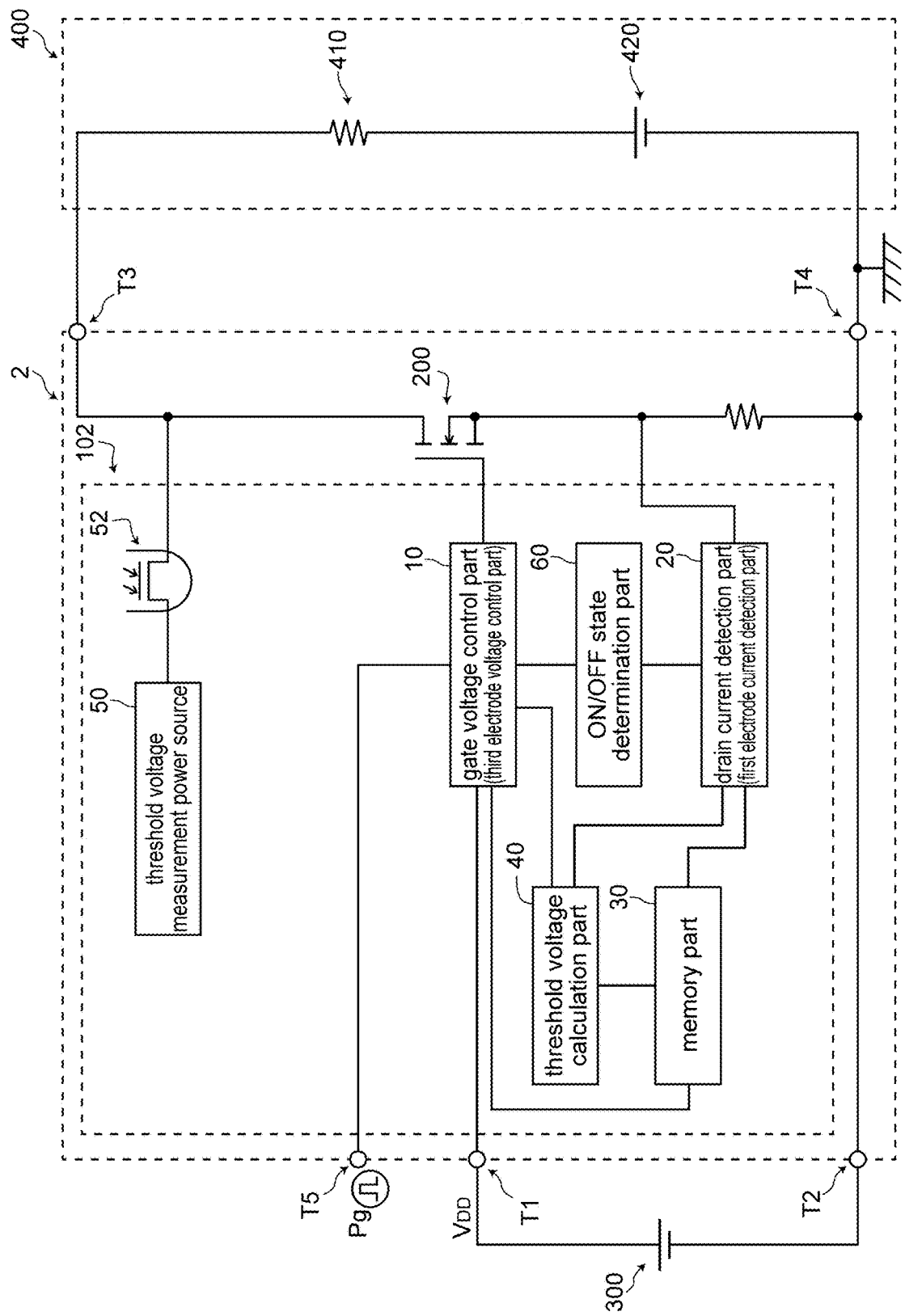
FIG. 5 is a circuit diagram showing a power module 2 and a switching element control circuit 102 according to an embodiment 2.

A switching element control circuit 102 according to the embodiment 2 has basically substantially the same configuration as the switching element control circuit 100 according to the embodiment 1. However, the switching element control circuit 102 according to the embodiment 2 differs from the switching element control circuit 100 according to the embodiment 1 with respect to a point that the switching element control circuit 102 further includes a threshold voltage measurement power source and an ON/OFF state determination part. That is, the switching element control circuit 102 according to the embodiment 2 is a switching element control circuit which changes a mode between an initial threshold voltage measurement mode where an initial threshold voltage $Vth_0$ of a switching element 200 is measured and a control mode where an ON/OFF operation of the switching element 200 is controlled (see FIG. 5).

A threshold voltage measurement power source 50 is connected to a drain electrode of the switching element 200. In the initial threshold voltage measurement mode, the threshold voltage measurement power source 50 supplies an electric current for a threshold voltage measurement to a drain electrode (first electrode) of the switching element 200 by turning on a threshold voltage measurement switch 52.

As the threshold voltage measurement switch 52, a suitable switch can be used. For example, a photocoupler can be used.

In the initial threshold voltage measurement mode, an ON/OFF state determination part 60 determines an ON/OFF state of the switching element 200 based on a detection result received from a drain current detection part 20. The ON/OFF state determination part 60 is connected to the drain current detection part 20 and a gate voltage control part 10.

A memory part 30 is connected not only to a threshold voltage calculation part 40 but also to the gate voltage control part 10 and the drain current detection part 20.

The switching element control circuit 102 according to the embodiment 2 is operated as follows.

(1) Initial Threshold Voltage Measurement Mode

The initial threshold voltage measurement mode is a mode where an initial threshold voltage $Vth_0$ of the switching element 200 connected to the switching element control circuit 102 is measured. This mode is performed before the switching element control circuit 102 and the switching element 200 are driven.

Figure 6:
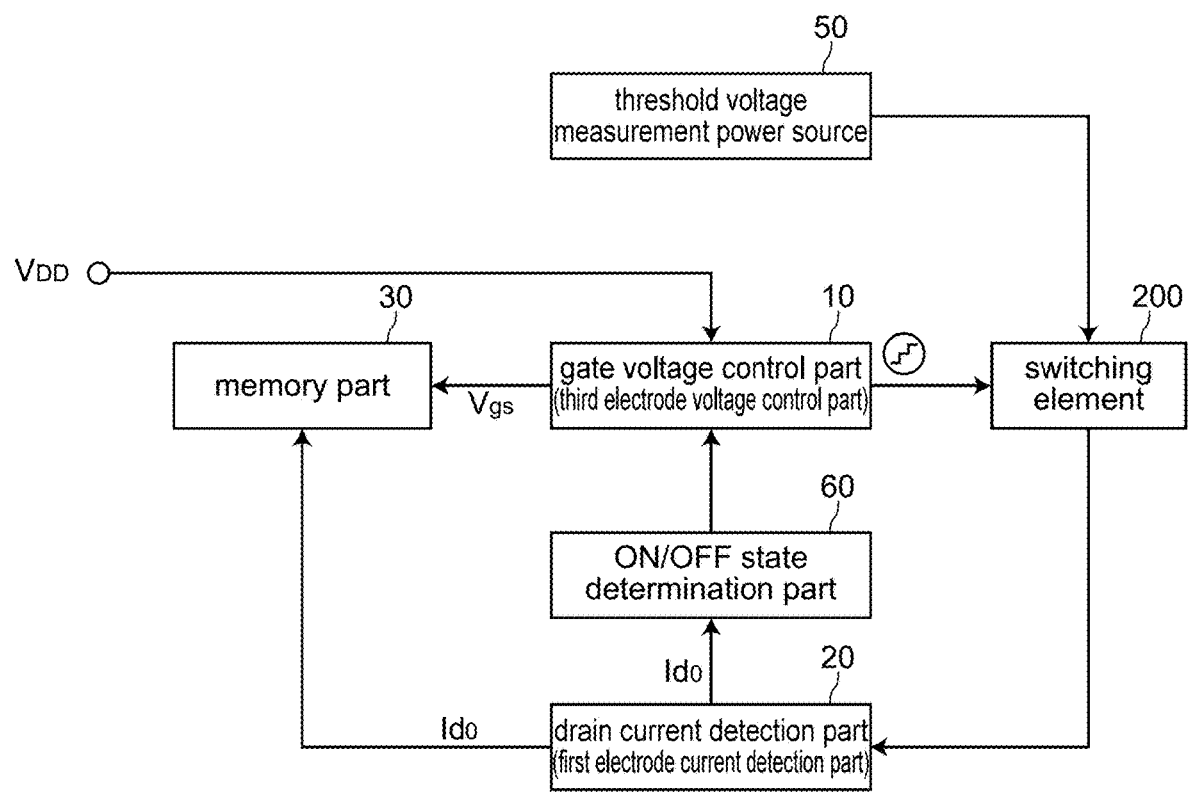
FIG. 6 is a block diagram for explaining an initial threshold voltage measurement mode of the switching element control circuit 102 according to the embodiment 2.

First, in a state where an electric current is not supplied from a drive power source 420, an electric current for the threshold voltage measurement is supplied to the drain electrode of the switching element 200 from the threshold voltage measurement power source 50 (see FIG. 6).

Figure 7:
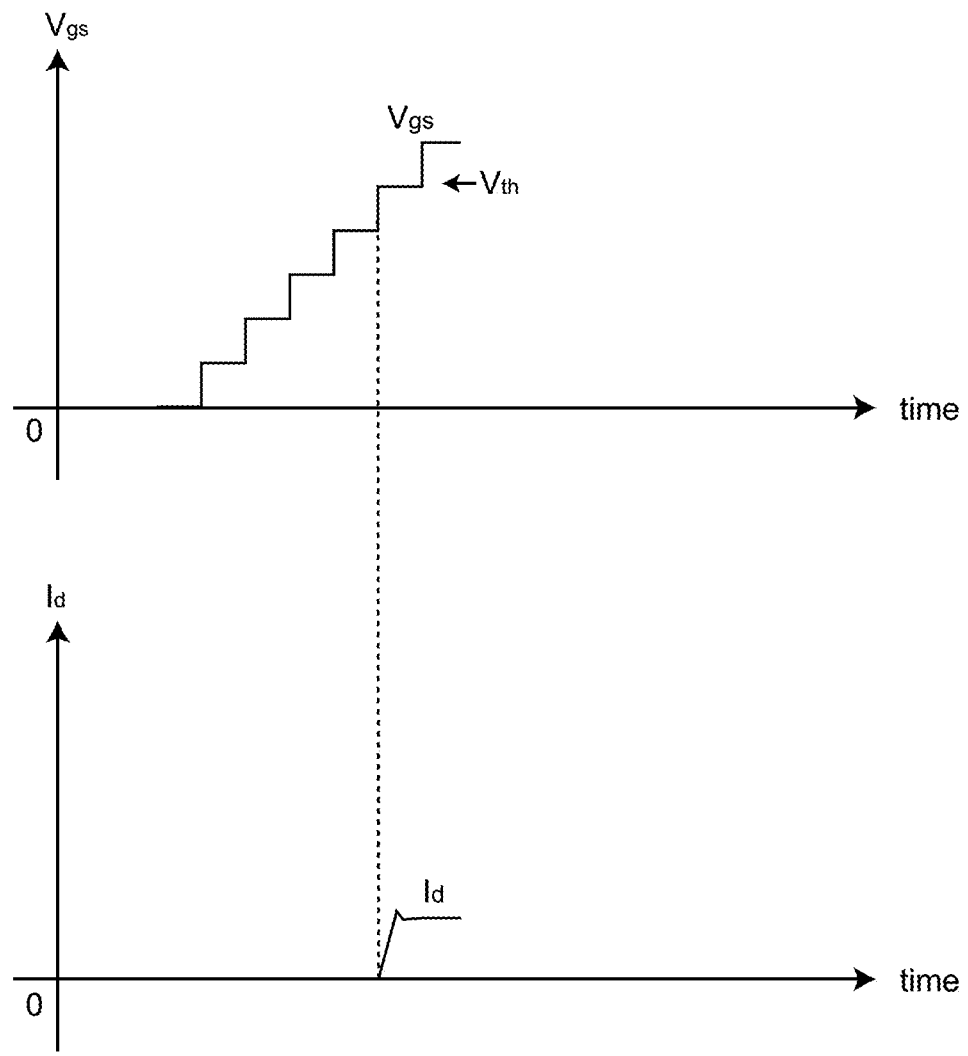
FIG. 7 is a schematic graph for explaining the initial threshold voltage measurement mode in the embodiment 2.

Next, the gate voltage control part 10 controls a gate voltage such that a voltage lower than an estimated initial threshold voltage is applied to the gate electrode. At this stage of operation, a drain current is not detected by the drain current detection part 20 (a value of the drain current being 0) and hence, the ON/OFF state determination part 50 determines that the switching element 200 is in an OFF state. When the ON/OFF state determination part 50 determines that the switching element 200 is in an OFF state, the gate voltage control part 10 controls the gate voltage such that the gate voltage is increased by one stage (see FIG. 7).

The gate voltage is increased in a stepwise manner (to be more specific, increased in a step-like manner) by repeating such an operation. When a drain current is detected by the drain current detection part 20 (when the drain current takes a value other than 0), the ON/OFF state determination part 60 determines that the switching element 200 is in an ON state. At this stage of operation, a drain current flowing through the switching element 200 which is detected by the drain current detection part 20 is transmitted to the memory part 30, and the gate voltage control part 10 transmits a gate voltage Vgs applied to the gate electrode to the memory part 30. Then, the memory part 30 stores the drain current as an initial drain current $Id_0$, and stores the gate voltage Vgs, as an initial threshold voltage $Vth_0$.

(2) Control Mode

In the control mode, when the switching element 200 is brought into an ON state, the threshold voltage calculation part 40 calculates a threshold voltage Vth at the time of operating the switching element based on an initial threshold voltage $Vth_0$ and an initial drain current $Id_0$ measured in the initial threshold voltage measurement mode, a drain current Id flowing through the switching element 200 which is detected by the drain current detection part 20, and information (a drain current coefficient β) relating to a drain current characteristic of a threshold voltage of the switching element stored in the memory part 30 in advance (by putting these values to the characteristic formula $Vth=Vth_0+\beta(Id-Id_0)$) (see FIG. 4). The gate voltage control part 10 applies a gate voltage which slightly exceeds a threshold voltage Vth at the time of operating the switching element which is calculated by the threshold voltage calculation part 40 to the gate electrode.

In this manner, the switching element control circuit 102 according to the embodiment 2 differs from the case of the switching element control circuit 100 according to the embodiment 1 with respect to the point that the switching element control circuit 102 further includes the threshold voltage measurement power source and the ON/OFF state determination part. However, in the same manner as the switching element control circuit 100 according to the embodiment 1, the threshold voltage calculation part 40 calculates a threshold voltage Vth at the time of operating the switching element 200 based on information including a drain current detected by the drain current detection part 20, and the gate voltage control part 10 controls a gate voltage based on the threshold voltage Vth at the time of operating the switching element 200 calculated by the threshold voltage calculation part 40 when the switching element 200 is brought into an ON state. Accordingly, even when the threshold voltage Vth at the time of operating the switching element 200 changes from an initial threshold voltage $Vth_0$ due to supplying of a relatively large current to the switching element 200 at the time of operating the switching element 200 (see FIG. 4), it is possible to apply a voltage which slightly exceeds the threshold voltage at the time of operating the switching element 200 to the gate electrode (see FIG. 3B). Accordingly, a turn-on period and a turn-off period can be shortened. As a result, a switching loss can be reduced.

Further, according to the switching element control circuit 102 and a power module 2 according to the embodiment 2, in the initial threshold voltage measurement mode, an actual threshold voltage of the switching element 200, which is actually connected to the switching element control circuit 102, can be measured. Accordingly, even in the case where an actual threshold voltage changes from a threshold voltage on design due to irregularities in manufacture of the switching element 200, when the switching element 200 is brought into an ON state, it is possible to apply a gate voltage which slightly exceeds an actual threshold voltage to the gate electrode of the switching element 200 based on the actual threshold voltage. Accordingly, compared to a case where a gate voltage which largely exceeds a threshold voltage is applied to a gate electrode of the switching element 200 for controlling an ON/OFF operation of the switching element 200 with certainty (comparison example, see FIG. 3A), a turn-on period and a turn-off period can be shortened in this embodiment 2. Accordingly, a switching speed of the switching element 200 can be increased. As a result, a switching loss of the switching element 200 can be reduced.

Further, according to the switching element control circuit 102 and the power module 2 of the embodiment 2, as described previously, when the switching element 200 is brought into an ON state, a gate voltage which slightly exceeds an actual threshold voltage can be applied to the gate electrode based on the actual threshold voltage. Accordingly, even in the case where an actual threshold voltage changes such that the actual threshold voltage becomes higher than a threshold voltage on design due to irregularities in manufacture of the switching element 200, it is possible to apply a gate voltage which slightly exceeds an actual threshold voltage to the gate electrode. Accordingly, it is possible to prevent the occurrence of a phenomenon where the switching element 200 is not brought into an ON state even when the gate voltage which slightly exceeds a threshold voltage (threshold voltage on design) is applied to the gate electrode. As a result, an ON/OFF operation of the switching element 200 can be controlled with certainty.

Particularly, even in the case where a difference between an absolute maximum rated voltage of the gate electrode and a threshold voltage of the gate electrode is small as in the case where the switching element 200 is formed using a material which contains GaN, a gate voltage which slightly exceeds an actual threshold voltage can be applied to the gate electrode. Accordingly, it is possible to prevent the occurrence of a phenomenon where the switching element 200 is not brought into an ON state even when the gate voltage which slightly exceeds a threshold voltage (threshold voltage on design) is applied to the gate electrode. As a result, an ON/OFF operation of the switching element 200 can be controlled with certainty.

Further, according to the switching element control circuit 102 and the power module 2 of the embodiment 2, in an initial threshold voltage measurement mode, an actual threshold voltage can be measured, and in a control mode, when the switching element is brought into an ON state, a gate voltage applied to the gate electrode can be controlled based on information including an actual threshold voltage. Accordingly, even when the switching elements 200 are manufactured on a mass production basis, it is unnecessary to measure a threshold voltage of each manufactured switching element before the switching element 200 is connected to the switching element control circuit 102. Accordingly, a measurement operation does not become cumbersome and hence, productivity can be easily enhanced.

Further, according to the switching element control circuit 102 of the embodiment 2, the gate voltage control part 10 controls a gate voltage such that the gate voltage is increased in a step like manner along with a lapse of time in an initial threshold voltage measurement mode. Accordingly, it is possible to measure a threshold voltage of the switching element 200 efficiently and with certainty.

The switching element control circuit 102 according to the embodiment 2 has substantially the same configuration as the switching element control circuit 100 according to the embodiment 1 with respect to points other than the point that the switching element control circuit 102 further includes the threshold voltage measurement power source and the ON/OFF state determination part. Accordingly, the switching element control circuit 102 according to the embodiment 2 acquires the corresponding advantageous effects found amongst all advantageous effects which the switching element control circuit 100 according to the embodiment 1 acquires.

Embodiment 3

A switching element control circuit according to the embodiment 3 has basically substantially the same configuration as the switching element control circuit 102 according to the embodiment 2. However, the switching element control circuit according to the embodiment 3 differs from the switching element control circuit 102 according to the embodiment 2 with respect to a point that the switching element control circuit according to the embodiment 3 further includes a drain current characteristic calculation part (first electrode current characteristic calculation part). That is, the switching element control circuit according to the embodiment 3 is a switching element control circuit which performs a drain current characteristic measurement mode (first electrode current characteristic measurement mode) where a drain current characteristic of a threshold voltage of a switching element 200 is measured after a control mode is performed for a predetermined time.

A drain current characteristic calculation part 70 is connected to a memory part 30 (see FIG. 8), and calculates a drain current characteristic of a threshold voltage of the switching element 200.

In the drain current characteristic measurement mode, the following operations are performed.

Figure 8:
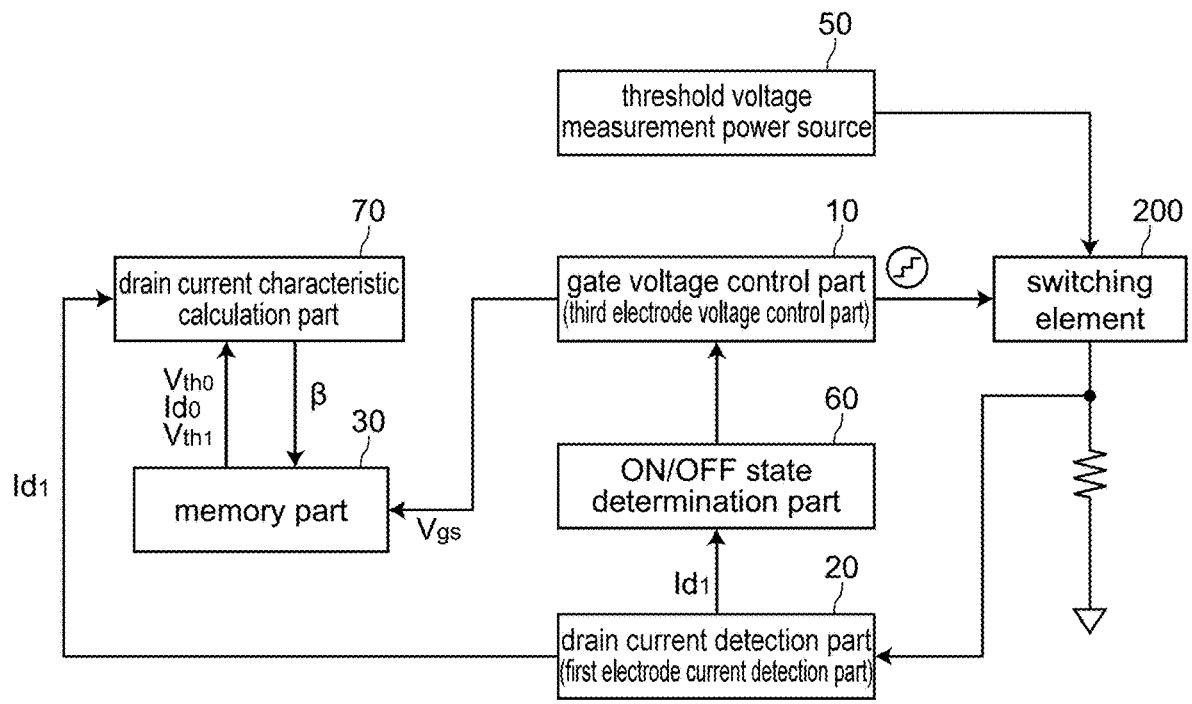
FIG. 8 is a block diagram for explaining a drain current characteristic measurement mode in an embodiment 3.

After the control mode is performed for the predetermined time, an electric current for a threshold voltage measurement is supplied to a drain electrode of the switching element 200 from a threshold voltage measurement power source 50 in a state where an electric current is not supplied from a drive power source 420 (see FIG. 8).

Next, a gate voltage control part 10 controls a gate voltage such that a voltage lower than an estimated threshold voltage (at the time of operating the switching element 200) is applied to the gate electrode. At this stage of operation, a drain current is not detected by a drain current detection part 20 (a value of the drain current being 0) and hence, an ON/OFF state determination part 60 determines that the switching element 200 is in an OFF state. When the ON/OFF state determination part 60 determines that the switching element 200 is in an OFF state, the gate voltage control part 10 controls the gate voltage such that the gate voltage is increased by one stage (see FIG. 7).

The gate voltage is increased in a stepwise manner (to be more specific, increased in a step-like manner) by repeating such an operation. When a drain current is detected by the drain current detection part 20 (when the drain current takes a value other than 0), the ON/OFF state determination part 60 determines that the switching element 200 is in an ON state. Further, the gate voltage control part 10 transmits a gate voltage Vgs applied to the gate electrode the memory part 30 as a drain current characteristic measurement time threshold voltage $Vth_1$ (first electrode current characteristic measurement time threshold voltage), and the memory part 30 stores the gate voltage Vgs as the drain current characteristic measurement time threshold voltage $Vth_1$.

Figure 9:
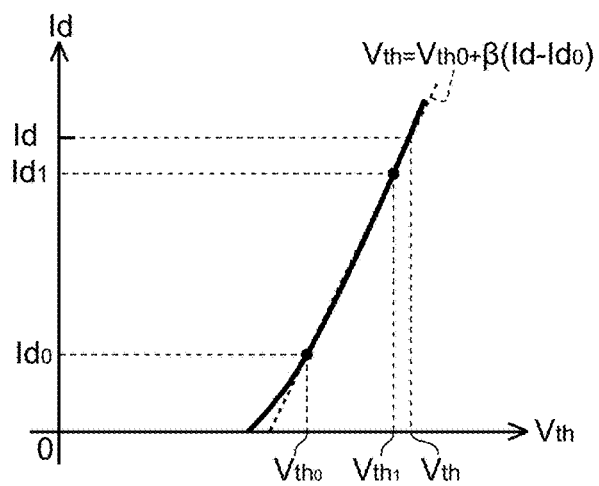
FIG. 9 is a schematic graph showing a relationship between a threshold voltage Vth and a drain current Id of the switching element in a switching element control circuit according to the embodiment 3.

Next, the drain current characteristic calculation part 70 reads information including an initial threshold voltage $Vth_0$, an initial drain current $Id_0$, and a drain current characteristic measurement time threshold voltage $Vth_1$ from the memory part 30. Further, in a drain current characteristic measurement mode, the drain current characteristic calculation part 70 reads a drain current $Id_1$ detected by the drain current detection part 20, and calculates drain current characteristic (more specifically, a drain current coefficient β) by putting $Vth=Vth_1$, and $Id=Id_1$ into the characteristic formula of $Vth=Vth_0+\beta(Id-Id_0)$ (see FIG. 9). The calculated drain current coefficient β is stored in the memory part 30.

In a control mode, a threshold voltage calculation part 40 calculates a threshold voltage Vth based on a drain current coefficient β calculated in the drain current characteristic measurement mode, a drain current Id which flows through the switching element 200 detected by the drain current detection part 20 at the time of operating the switching element 200, an initial threshold voltage $Vth_0$ and an initial drain current $Id_0$ stored in the memory part 30, and the gate voltage control part 10 controls a gate voltage based on the threshold voltage Vth.

In this manner, the switching element control circuit according to the embodiment 3 differs from the case of the switching element control circuit 102 according to the embodiment 2 with respect to the point that the switching element control circuit according to the embodiment 3 further includes the drain current characteristic calculation part. However, in the same manner as the switching element control circuit 102 according to the embodiment 2, the threshold voltage calculation part 40 calculates a threshold voltage Vth at the time of operating the switching element 200 based on information including a drain current detected by the drain current detection part 20, and the gate voltage control part 10 controls a gate voltage based on the threshold voltage Vth at the time of operating the switching element 200 calculated by the threshold voltage calculation part 40 when the switching element 200 is brought into an ON state. Accordingly, even when the threshold voltage Vth changes from an initial threshold voltage $Vth_0$ due to supplying of a relatively large current to the switching element 200 at the time of operating the switching element 200 (see FIG. 4), it is possible to apply a voltage which slightly exceeds the threshold voltage at the time of operating the switching element 200 to the gate electrode (see FIG. 3A and FIG. 3B). Accordingly, a turn-on period and a turn-off period can be shortened. As a result, a switching loss can be reduced.

Further, according to the switching element control circuit of the embodiment 3, the switching element control circuit includes the drain current characteristic calculation part 70 and hence, it is possible to calculate a drain current characteristic based on threshold voltages measured at different drain currents (threshold voltages measured at a plurality of points) Accordingly, even in the case where a drain current characteristic of a switching element actually connected to the switching element control circuit changes from a drain current characteristic on design due to irregularities in the manufacture of the switching element, it is possible to more accurately calculate a drain current characteristic (drain current coefficient) of a threshold voltage of the switching element. Accordingly, it is possible to apply a gate voltage which slightly exceeds an actual threshold voltage to the gate electrode.

The switching element control circuit according to the embodiment 3 has substantially the same configuration as the switching element control circuit 102 according to the embodiment 2 with respect to points other than the point that the switching element control circuit according to the embodiment 3 further includes the drain current characteristic calculation part. Accordingly, the switching element control circuit according to the embodiment 3 acquires the corresponding advantageous effects found amongst all advantageous effects which the switching element control circuit 102 according to the embodiment 2 acquires.

Although the present invention has been described based on the above-mentioned embodiments, the present invention is not limited to the above-mentioned embodiments. The present invention can be carried out in various modes without departing from the gist of the present invention and, for example, the following modifications are also conceivable.

(1) The numbers and the like of the constitutional elements described in the above-mentioned embodiments are provided for an exemplifying purpose, and can be changed within a scope where advantageous effects of the present invention are not impaired.

(2) In the above-mentioned embodiment 3, the switching element control circuit is a switching element control circuit which performs an initial threshold voltage measurement mode, a drain current characteristic measurement mode, and a control mode. However, the present invention is not limited to such a switching element control circuit. For example, a switching element control circuit which performs only a drain current characteristic measurement mode and a control mode may be adopted. In this case, an initial threshold voltage and an initial drain current are stored in a memory part in advance.

Figure 10:
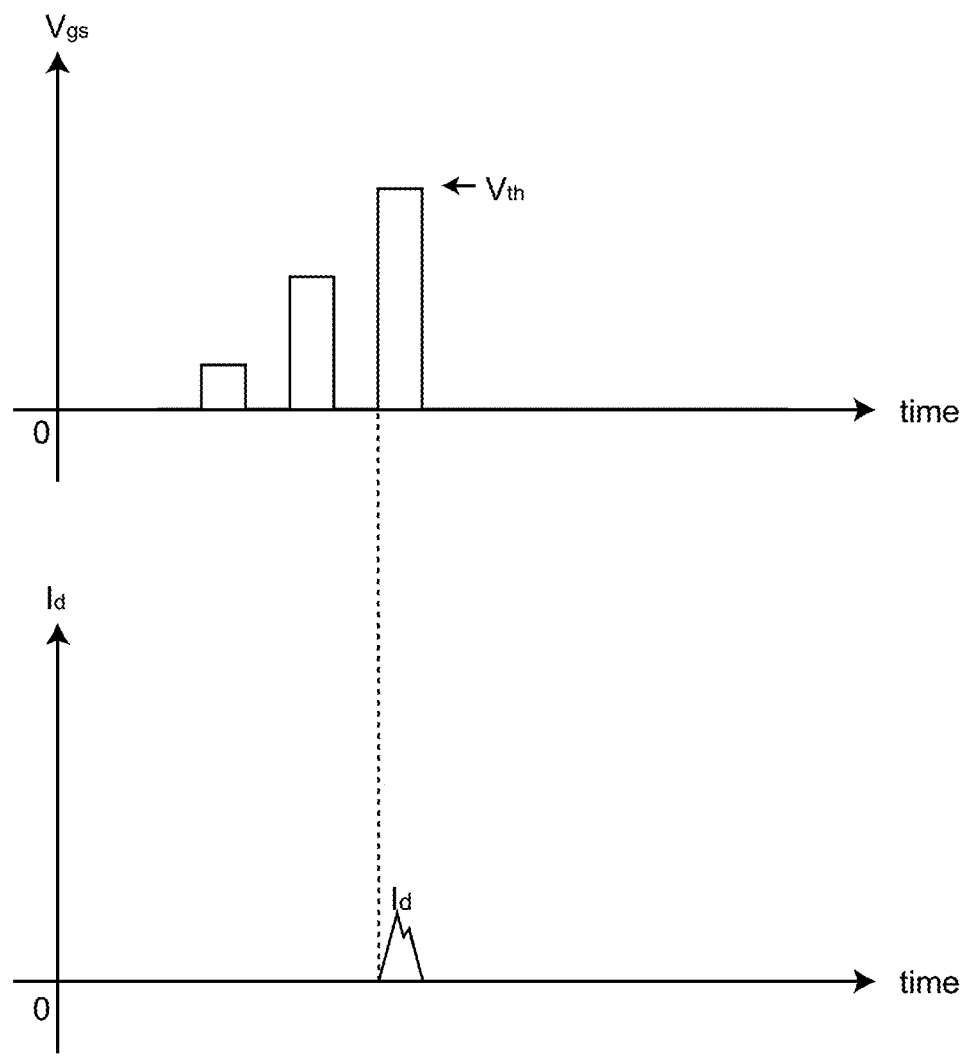
FIG. 10 is a schematic graph for explaining an initial threshold voltage measurement mode (and/or a drain current characteristic measurement mode) in a modification 1.

(3) In the initial threshold voltage measurement mode in the above-mentioned embodiments 2 and 3, and in the drain current characteristic measurement mode in the embodiment 3, the gate voltage control part 10 controls a gate voltage such that the gate voltage is increased in a step-like manner along with a lapse of time. However, the present invention is not limited to such modes. For example, in the initial threshold voltage measurement mode and the drain current characteristic measurement mode, the gate voltage control part 10 may control a gate voltage such that the gate voltage becomes a pulse-like voltage which is a pulse increasing an amplitude along with a lapse of time (see FIG. 10).

Figure 11:
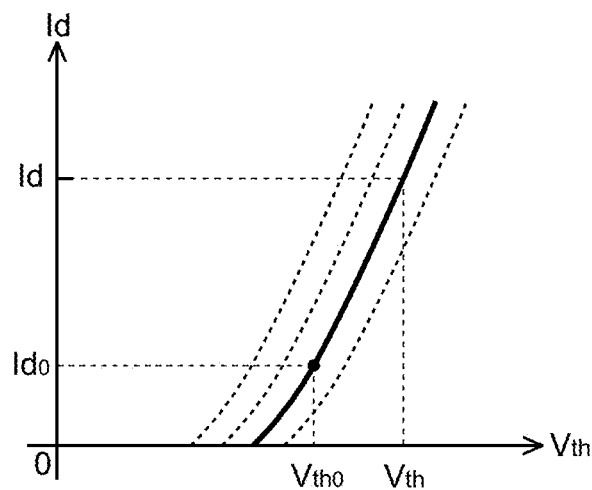
FIG. 11 is a schematic graph showing a relationship between a threshold voltage Vth and a drain current Id of the switching element in a switching element control circuit according to a modification 2.
Figure 12:
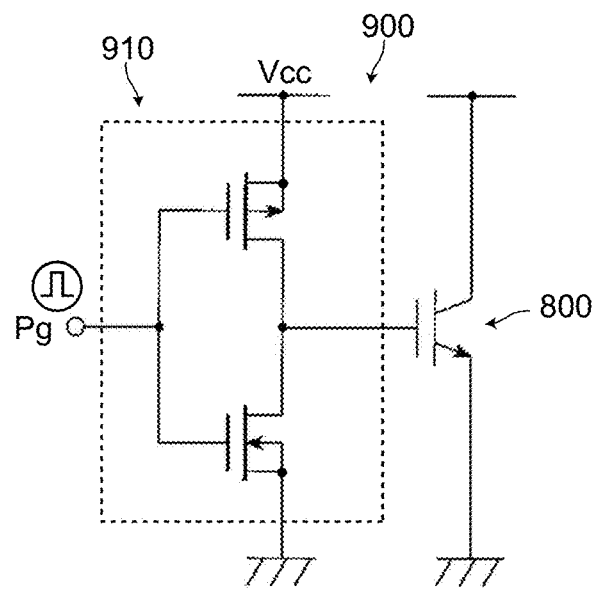
FIG. 12 is a view for explaining a conventional switching element control circuit 900.

(4) In the above-mentioned respective embodiments, information relating to a drain current characteristic of a threshold voltage of the switching element is expressed by the characteristic formula which satisfies the relationship of $Vth=Vth_0+\beta(Id-Id_0)$. However, the present invention is not limited to such information. For example, information relating to a drain current characteristic of a threshold voltage of the switching element may be expressed by a (multidimensional) characteristic formula closer to an actual graph (see a solid line in FIG. 4), or the information may contain data where a drain current and a threshold voltage corresponding to the drain current form a pair (see FIG. 11). In this case, a threshold voltage which corresponds to the detected drain current, when a drain current is detected, is assumed as a threshold voltage at the time of operating the switching element.

(5) In the above-mentioned respective embodiments, one characteristic formula is prepared in the memory part 30, and a threshold voltage at the time of operating the switching element is calculated. However, the present invention is not limited to such a mode. For example, a mode may be adopted where a plurality of characteristic formulae are prepared in the memory part 30, a characteristic formula is identified by detecting a drain current using the drain current detection part 20, and a threshold voltage is calculated using the characteristic formula identified by detection of a drain current at the time of operating the switching element.

(6) In the above-mentioned respective embodiments, the switching element control circuit controls one switching element. However, the present invention is not limited to such a configuration. The switching element control circuit may control a plurality of switching elements.

(7) In the above-mentioned respective embodiments, the switching element is formed using a material which contains GaN. However, the present invention is not limited to such a configuration. The switching element may be formed using a material which contains a wide-gap semiconductor such as SiC or $Ga_2O_3$ or may be formed using a material which contains silicon.

(8) In the above-mentioned embodiments, a MOSFET is used as the switching element. However, the present invention is not limited to such a configuration. A switching element (for example, a HEMT, an IGBT or the like) other than a MOSFET may be used as the switching element.

(9) In the above-mentioned respective embodiments, the switching element control circuit and the switching element may be formed on separate semiconductor substrates or the switching element control circuit and the switching element (for example, a semiconductor element having a lateral structure formed using GaN) are formed on the same semiconductor substrate.

The invention claimed is:

1. A switching element control circuit for controlling an ON/OFF operation of a switching element which includes a first electrode, a second electrode, and a third electrode, the switching element control circuit comprising:
   a third electrode voltage control part which controls a third electrode voltage for controlling the ON/OFF operation of the switching element;
   a first electrode current detection part which detects a first electrode current which flows through the switching element;
   a memory part which stores information including an initial threshold voltage of the switching element and an initial first electrode current which flows through the switching element when the initial threshold voltage is measured, and information relating to a first electrode current characteristic of a threshold voltage of the switching element; and
   a threshold voltage calculation part which calculates a threshold voltage at a time of operating the switching element based on information including the initial threshold voltage, the initial first electrode current, and a first electrode current detected by the first electrode current detection part, and information relating to the first electrode current characteristic of the threshold voltage of the switching element, wherein
   the third electrode voltage control part controls the third electrode voltage, at the time of bringing the switching element into an ON state, based on a threshold voltage Vth at the time of operating the switching element calculated by the threshold voltage calculation part, and
   the first electrode current characteristic of the threshold voltage of the switching element is expressed by a characteristic formula which satisfies a relationship of $Vth=Vth_0+\beta(Id-Id_0)$ assuming that a first electrode current coefficient of the threshold voltage of the switching element is $\beta$, the threshold voltage at the time of operating the switching element is Vth, the initial threshold voltage is $Vth_0$, the first electrode current detected by the first electrode current detection part is Id, and the initial first electrode current is $Id_0$.

2. The switching element control circuit according to claim 1, wherein the switching element control circuit is a switching element control circuit which performs an initial threshold voltage measurement mode where the initial threshold voltage of the switching element is measured, and a control mode where the ON/OFF operation of the switching element is controlled,
   the switching element control circuit further comprises:
      a threshold voltage measurement power source which supplies a threshold voltage measurement current to the first electrode of the switching element; and
      an ON/OFF state determination part which determines an ON/OFF state of the switching element, and
   in the initial threshold voltage measurement mode,
      the third electrode voltage control part controls the third electrode voltage such that the third electrode voltage is increased in a stepwise manner,
      the ON/OFF state determination part determines whether or not the switching element is turned on based on the first electrode current detected by the first electrode current detection part, and
      the memory part stores the first electrode current detected by the first electrode current detection part as the initial first electrode current and stores the third electrode voltage applied to the third electrode as the initial threshold voltage of the switching element when the ON/OFF state determination part determines that the switching element is brought into an ON state.

3. The switching element control circuit according to claim 2, wherein the switching element control circuit is a switching element control circuit which further performs a first electrode current characteristic measurement mode where a first electrode current characteristic of a threshold voltage of the switching element is measured after the control mode is performed for a predetermined time,
   the switching element control circuit further comprises a first electrode current characteristic calculation part which calculates a first electrode current characteristic of a threshold voltage of the switching element, and
   in the first electrode current characteristic measurement mode,
      the third electrode voltage control part controls the third electrode voltage such that the third electrode voltage is increased in a stepwise manner,
      the ON/OFF state determination part determines whether or not the switching element is turned on based on the first electrode current detected by the first electrode current detection part,
      the memory part stores the first electrode current detected by the first electrode current detection part and stores the third electrode voltage applied to the third electrode as a first electrode current characteristic measurement time threshold voltage of the switching element when the ON/OFF state determination part determines that the switching element is brought into an ON state, and
      the first electrode current characteristic calculation part calculates the first electrode current characteristic of the threshold voltage of the switching element based on information including the initial threshold voltage, the initial first electrode current, the first electrode current detected by the first electrode current detection part in the first electrode current characteristic measurement mode, and the first electrode current characteristic measurement time threshold voltage.

4. The switching element control circuit according to claim 2, wherein the third electrode voltage control part controls the third electrode voltage such that the third electrode voltage is increased in a step-like manner along with a lapse of time in the initial threshold voltage measurement mode.

5. The switching element control circuit according to claim 2, wherein the third electrode voltage control part controls the third electrode voltage such that the third electrode voltage becomes a pulse-like voltage which is a pulse increasing an amplitude along with a lapse of time in the initial threshold voltage measurement mode.

6. The switching element control circuit according to claim 1, wherein the switching element control circuit is a switching element control circuit which performs a first electrode current characteristic measurement mode where the first electrode current characteristic of the threshold voltage of the switching element is measured after a control mode where an ON/OFF operation of the switching element is controlled is performed for a predetermined time, the switching element control circuit further comprises:
a threshold voltage measurement power source which supplies a threshold voltage measurement current to the first electrode of the switching element;
an ON/OFF state determination part which determines an ON/OFF state of the switching element; and
a first electrode current characteristic calculation part which calculates a first electrode current characteristic of a threshold voltage of the switching element, and in the first electrode current characteristic measurement mode,
the third electrode voltage control part controls the third electrode voltage such that the third electrode voltage is increased in a stepwise manner,
the ON/OFF state determination part determines whether or not the switching element is turned on based on the first electrode current detected by the first electrode current detection part,
the memory part, when the ON/OFF state determination part determines that the switching element is brought into an ON state, stores the first electrode current which flows through the switching element and stores the third electrode voltage applied to the third electrode as a first electrode current characteristic measurement time threshold voltage of the switching element, and
the first electrode current characteristic calculation part calculates the first electrode current characteristic of a threshold voltage of the switching element based on information including the initial threshold voltage, the initial first electrode current, the first electrode current which flows through the switching element in the first electrode current characteristic measurement mode, and the first electrode current characteristic measurement time threshold voltage.

7. The switching element control circuit according to claim 6, wherein the third electrode voltage control part controls the third electrode voltage such that the third electrode voltage is increased in a step-like manner along with a lapse of time in the first electrode current characteristic measurement mode.

8. The switching element control circuit according to claim 6, wherein the third electrode voltage control part controls the third electrode voltage such that the third electrode voltage becomes a pulse-like voltage which is a pulse increasing an amplitude along with a lapse of time in the first electrode current characteristic measurement mode.

9. The switching element control circuit according to claim 1, wherein the switching element is a MOSFET, an IGBT or a HEMT.

10. The switching element control circuit according to claim 1, wherein the switching element is formed using a material which contains GaN, SiC or $Ga_2O_3$.

11. A power module, comprising:
a switching element provided with a first electrode, a second electrode and a third electrode; and
the switching element control circuit according to claim 1 which controls an ON/OFF operation of the switching element.

12. A switching element control circuit for controlling an ON/OFF operation of a switching element which includes a first electrode, a second electrode, and a third electrode, the switching element control circuit comprising:
a third electrode voltage control part which controls a third electrode voltage for controlling the ON/OFF operation of the switching element;
a first electrode current detection part which detects a first electrode current which flows through the switching element;
a memory part which stores information including an initial threshold voltage of the switching element and an initial first electrode current which flows through the switching element when the initial threshold voltage is measured, and information relating to a first electrode current characteristic of a threshold voltage of the switching element; and
a threshold voltage calculation part which calculates a threshold voltage at a time of operating the switching element based on information including the initial threshold voltage, the initial first electrode current, and a first electrode current detected by the first electrode current detection part, and information relating to the first electrode current characteristic of the threshold voltage of the switching element, wherein
the third electrode voltage control part controls the third electrode voltage, at the time of bringing the switching element into an ON state, based on a threshold voltage Vth at the time of operating the switching element calculated by the threshold voltage calculation part, and
the information including the initial threshold voltage and the initial first electrode current, and the information relating to the first electrode current characteristic of the threshold voltage of the switching element are stored in the memory part in advance.

13. The switching element control circuit according to claim 12, wherein the information relating to the first electrode current characteristic of the threshold voltage of the switching element includes data where the first electrode current and the threshold voltage corresponding to the first electrode current form a pair.

14. The switching element control circuit according to claim 12, wherein the switching element is a MOSFET, an IGBT or a HEMT.

15. The switching element control circuit according to claim 12, wherein the switching element is formed using a material which contains GaN, SiC or $Ga_2O_3$.

16. A power module, comprising:
a switching element provided with a first electrode, a second electrode and a third electrode; and
the switching element control circuit according to claim 12 which controls an ON/OFF operation of the switching element.

* * * * *